(12) United States Patent
Wang et al.

(10) Patent No.: US 11,227,794 B2
(45) Date of Patent: Jan. 18, 2022

(54) METHOD FOR MAKING SELF-ALIGNED BARRIER FOR METAL VIAS IN-SITU DURING A METAL HALIDE PRE-CLEAN AND ASSOCIATED INTERCONNECT STRUCTURE

(71) Applicant: TAIWAN SEMICONDUCTOR MANUFACTURING CO., LTD., Hsinchu (TW)

(72) Inventors: Sung-Li Wang, Hsinchu County (TW); Shuen-Shin Liang, Hsinchu County (TW); Yu-Yun Peng, Hsinchu (TW); Fang-Wei Lee, Hsinchu (TW); Chia-Hung Chu, Taipei (TW); Mrunal Abhijith Khaderbad, Hsinchu (TW); Keng-Chu Lin, Pingtung County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 103 days.

(21) Appl. No.: 16/721,762

(22) Filed: Dec. 19, 2019

(65) Prior Publication Data
US 2021/0193511 A1 Jun. 24, 2021

(51) Int. Cl.
*H01L 21/768* (2006.01)
*H01L 21/306* (2006.01)
(Continued)

(52) U.S. Cl.
CPC .. *H01L 21/76816* (2013.01); *H01L 21/02063* (2013.01); *H01L 21/02068* (2013.01); *H01L 21/28562* (2013.01); *H01L 21/30604* (2013.01); *H01L 21/7685* (2013.01); *H01L 21/76849* (2013.01); *H01L 21/76856* (2013.01); *H01L 21/76864* (2013.01); *H01L 21/76879* (2013.01); *H01L 21/76883* (2013.01);
(Continued)

(58) Field of Classification Search
CPC ....... H01L 23/53209–53266; H01L 23/53223; H01L 23/53238; H01L 23/53252; H01L 23/53266; H01L 21/76897; H01L 21/76838–76892; H01L 21/76841–76876; H01L 21/76843; H01L 21/76849; H01L 21/7685; H01L 21/76852; H01L 21/76853; H01L 21/76856; H01L 21/76861; H01L 21/76864; H01L 21/76867; H01L 21/76877–76883; H01L 21/76879; H01L 21/76883; H01L 21/02063; H01L 21/02068; H01L 23/5226
See application file for complete search history.

(56) References Cited

U.S. PATENT DOCUMENTS 9,105,490 B2 8/2015 Wang et al.
9,236,267 B2 1/2016 De et al.
(Continued)

*Primary Examiner* — Younes Boulghassoul
(74) *Attorney, Agent, or Firm* — Maschoff Brennan

(57) ABSTRACT

A multi-layer interconnect structure with a self-aligning barrier structure and a method for fabricating the same is disclosed. For example, the method includes forming a via through an interlayer dielectric (ILD) layer, an etch stop layer (ESL), and a contact structure, pre-cleaning the via with a metal halide, forming a barrier structure on the contact structure in-situ during the pre-cleaning of the via with the metal halide, and depositing a second metal in the via on top of the barrier structure.

20 Claims, 12 Drawing Sheets

(51) Int. Cl.
  *H01L 23/522* (2006.01)
  *H01L 21/285* (2006.01)
  *H01L 21/02* (2006.01)
  *H01L 23/532* (2006.01)

(52) U.S. Cl.
  CPC .... *H01L 21/76897* (2013.01); *H01L 23/5226* (2013.01); *H01L 23/53223* (2013.01); *H01L 23/53252* (2013.01); *H01L 23/53266* (2013.01)

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 9,899,258 B1* | 2/2018 | Wu | H01L 21/76865 |
| 2004/0124537 A1* | 7/2004 | Takayama | H01L 23/53266 257/758 |
| 2007/0082132 A1* | 4/2007 | Shinriki | C23C 16/45542 427/255.394 |
| 2010/0013098 A1* | 1/2010 | Besling | H01L 21/76834 257/751 |
| 2010/0151673 A1* | 6/2010 | Furusawa | H01L 21/76877 438/627 |
| 2013/0196502 A1* | 8/2013 | Haukka | C23C 16/04 438/653 |
| 2017/0148670 A1* | 5/2017 | Lei | C23C 16/54 |
| 2017/0222008 A1* | 8/2017 | Hsu | H01L 21/76889 |
| 2019/0287851 A1* | 9/2019 | Chen | H01L 23/535 |
| 2020/0006230 A1* | 1/2020 | Tsai | H01L 23/53209 |
| 2020/0098623 A1* | 3/2020 | Cheng | H01L 23/53209 |
| 2020/0343135 A1* | 10/2020 | Huang | H01L 21/76805 |
| 2020/0343136 A1* | 10/2020 | Yu | H01L 21/76879 |

\* cited by examiner

METHOD FOR MAKING SELF-ALIGNED BARRIER FOR METAL VIAS IN-SITU DURING A METAL HALIDE PRE-CLEAN AND ASSOCIATED INTERCONNECT STRUCTURE

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Such scaling down has also increased the complexity of processing and manufacturing ICs. For example, previously used copper-based interconnect structures that are implemented in multilayer interconnect (MLI) features have presented performance, yield, and cost challenges as MLI features become more compact with ever-shrinking IC feature size. For example, copper interconnects exhibit increased resistance, poor electro-migration performance, and voids during fabrication as IC technologies expand into sub-20 nm technology nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
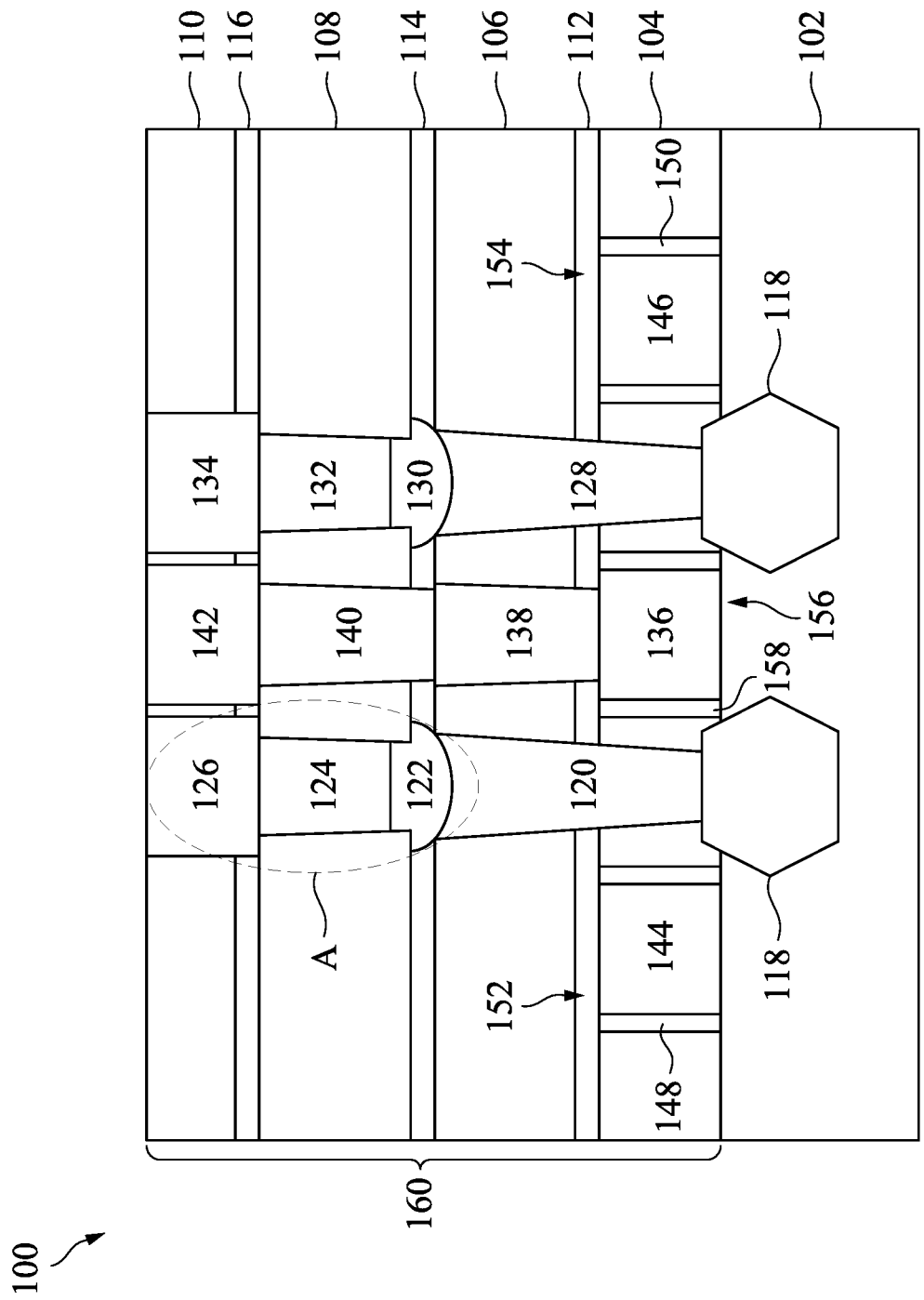
FIG. 1 illustrates a cross-sectional view of a multi-layer interconnect structure according to at least one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the devices described herein may be related to a FinFET device. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present disclosure is related to various embodiments of a method for forming a self-aligned barrier for metal vias. IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features).

MEOL generally encompasses processes related to fabricating contacts to conductive features (or conductive regions) of the IC devices, such as contacts to the gate structures and/or the source/drain features. BEOL generally encompasses processes related to fabricating interconnect structures that interconnect IC features fabricated by FEOL process (referred to herein as FEOL features or structures) and MEOL processes (referred to herein as MEOL features or structures), thereby enabling operation of the IC devices.

As the size of the ICs has shrunk, a transition to metal based vias (e.g., metals such as Ruthenium (Ru) has provided improved performance. For example, the Ru vias can lower the via resistance. However, fabricating the Ru vias has presented some challenges.

For example, depositing Ru directly on the metal to device (MD) metal layer may cause random portions of the metal to be missing from corrosion during the Ru deposition and Ru planarization. A previous solution was to implement an additional selective Tungsten (W) deposition step before the Ru deposition. However, the additional step adds processing costs and time and is relatively expensive.

In addition, previous processes used a physical Argon (Ar) pre-clean to clean remaining Tungsten oxides after the Tungsten cap was formed. However, the Ar pre-clean caused severe necking and critical dimension (CD) shrinkage.

The present disclosure provides a method that forms metal barrier structure in-situ using a chemical pre-clean procedure. For example, a metal halide may be used to clean the via. The metal halide may react with the etch stop layer to form a self-aligned barrier structure that provides a barrier between the MD metal and the metal that is deposited in the via.

In addition, a hydrogen plasma clean may be used to clean the barrier structure interface to remove any remaining metal oxide before the another metal (e.g., Ru) is deposited in the via. The hydrogen plasma clean may reduce the amount of necking and CD shrinkage as compared to the physical Ar pre-clean procedure. The hydrogen plasma clean may also prevent kinking. When kinks are formed by the physical Ar cleaning procedure, the lost portions of the via are reformed via a re-sputtering process, which can slow the overall process and increase costs.

FIG. 1 illustrates a cross-sectional view of an example of a structure of a portion of an integrated circuit (IC) device 100 of the present disclosure. The IC device 100 may be in a microprocessor, a memory, or any other type of integrated circuit device that includes additional passive and/or active microelectronic devices such as resistors, capacitors, inductors, diodes, p-type or n-type field effect transistors, metal-oxide semiconductor field effect transistors, complementary metal-oxide semiconductor transistors, bi-polar junction transistors, laterally diffused metal-oxide semiconductor transistors, and or other suitable components and combinations thereof.

It should be noted that FIG. 1 has been simplified for ease of explanation. Additional features can be added to the IC device 100 or are not shown. For example, the IC device 100 may also include isolation features that electrically isolate active device regions and/or passive device regions from one another. The isolation regions may include silicon oxide, silicon nitride, silicon oxynitride, or any combinations thereof. The isolation features may include shallow trench isolation structures, deep trench isolation structures, local oxidation of silicon structures, and the like.

In one embodiment, the IC device 100 may include a substrate 102. The substrate 102 may be part of a fin field effect transistor (FinFET). A FinFet may be a multi-gate transistor where multiple gates can be located around a channel within the IC device 100.

In one embodiment, the substrate 102 may be a semiconductor wafer, such as for example, silicon. The substrate 102 may include other elementary semiconductors, such as germanium, a compound semiconductor, such as silicon carbide, gallium arsenide, gallium phosphide, indium phosphide, indium arsenide, and/or indium antimonide, an alloy semiconductor, such as silicon germanium, GaAsP, AlInAs, AlGaAs, GaInAs, GaInP, and/or GaInAsP.

In one embodiment, various gate structures 152, 154, and 156 may be disposed over the substrate 102. In one embodiment, one or more of the gate structures 152, 154, and 156 may interpose a source region and a drain region, where a channel region is defined between the source region and the drain region. The one or more gate structures 152, 154, and 156 may be formed over a fin structure, such that the gate structures 152, 154, and 156 each wrap a portion of the fin structure. For example, one or more of the gate structures 152, 154, and 156 may wrap channel regions of the fin structure, thereby interposing a source region and a drain region of the fin structure.

In one embodiment, the gate structures 152, 154, and 156 may include metal gate stacks. For example, the gate structure 152 may include a metal gate stack 144, the gate structure 156 may include a metal gate stack 136, and the gate structure 154 may include the metal gate stack 146. The metal gate stacks 136, 144, and 146 may be configured to achieve desired functionality according to design requirements of the IC device 100.

The metal gate stacks 136, 144, and 146 may include the same or different layers and/or materials. In some examples, the metal gate stacks 136, 144, and 146 may include a gate dielectric and a gate electrode. The metal gate stacks 136, 144, and 146 may also include numerous other layers. For example, the metal gate stacks 136, 144, and 146 may include capping layers, interface layers, diffusion layers, barrier layers, hard mask layers, or combinations thereof.

The gate structures 152, 154, and 156 may be formed by a deposition process, lithography process, etching process, or other suitable processes, or combinations thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof.

The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing.

The etching processes include dry etching processes, wet etching processes, other etching processes, or combinations thereof. Metal gate stacks 136, 144, and 146 are fabricated according to a gate last process, a gate first process, or a hybrid gate last/gate first process. In gate last process implementations, gate structures 136, 144, and 146 include dummy gate stacks that are subsequently replaced with metal gate stacks 136, 144, and 146. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which metal gate stacks 136, 144, and 146 are formed.

The gate structures 152, 154, and 156 may further include spacers 148, 150, and 158. The spacers 148, 150, and 158 may be disposed adjacent to (e.g., along sidewalls of) the metal gate stacks 136, 144, and 146. For example, the spacer 148 may be adjacent to the metal gate stack 144, the spacer 158 may be adjacent to the metal gate stack 136, and the spacer 150 may be adjacent to the metal gate stack 146.

The spacers 148, 150, and 158 may be formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 102 and subsequently anisotropically etched to form spacers 148, 150, and 158. In some implementations, spacers 148, 150, and 158 may include a multi-layer structure, such as a first dielectric layer that includes silicon nitride and a second dielectric layer that includes silicon oxide.

In some implementations, more than one set of spacers, such as seal spacers, offset spacers, sacrificial spacers, dummy spacers, and/or main spacers, are formed adjacent to metal gate stacks 136, 144, and 146. In such implementations, the various sets of spacers can include materials having different etch rates. For example, a first dielectric layer including silicon and oxygen (for example, silicon oxide) can be deposited over substrate 102 and subsequently anisotropically etched to form a first spacer set adjacent to metal gate stacks 136, 144, and 146 (or dummy metal gate stacks, in some implementations), and a second dielectric layer including silicon and nitrogen (for example, silicon nitride) can be deposited over substrate 102 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in substrate 102 before and/or after forming spacers 148, 150, and 158, depending on design requirements of the IC device 100.

In one embodiment, the substrate 102 may include a source or drain (S/D) regions 118. FIG. 1 illustrates an example where the gate structure 156 interposes the S/D regions 118. Thus, the gate structure 156 and the S/D regions 118 may form a transistor, such as a pull-up transistor or a pull-down transistor. In some embodiments, the S/D regions 118 may wrap S/D regions of a fin structure.

In one embodiment, the S/D regions 118 may be doped with a p-type dopant or an n-type dopant to form p-type wells or n-type wells in the substrate 102. Examples of the p-type dopant may include boron, indium, and the like. Examples of n-type dopants may include phosphorus, arsenic, and the like. The dopants may be implanted into the substrate 102 using an ion implantation process, a diffusion process, or any other suitable doping process to form the S/D region 118.

In one embodiment, the IC device 100 may include a multi-layer interconnect (MLI) feature 160. In one embodiment, the MLI feature 160 may include one or more interlayer dielectric (ILD) layers. For example, the MLI 100 may include an ILD-0 layer 104, ILD-1 layer 106, ILD-2 layer 108, and ILD-3 layer 110. The ILD layers 104-110 may include dielectric material including, for example, silicon oxide, silicon nitride, silicon oxynitride, tetraethyl orthosilicate (TEOS) formed oxide, phosphosilicate glass (PSG), borphosphoslicate glass (BPSG), other suitable low-k dielectric materials, or any combination thereof. In some embodiments, the ILD layers 104-110 may include a multilayer structure having multiple dielectric materials.

In one embodiment, a contact etch stop layer or etch stop layer may be located between each part of ILD layers 104-110. For example, an ESL 112 may be located between the ILD-0 layer 104 and the ILD-1 layer 106, an ESL 114 may be located between the ILD-1 layer 106 and the ILD-2 layer 108, and an ESL 116 may be located between the ILD-2 layer 108 and the ILD-3 layer 110. In one embodiment, the ESL 112 and 116 may be silicon nitride.

In one embodiment, the ESL 114 may be silicon nitride or a metal oxide. In one embodiment, the ESL 114 may be aluminum oxide (AlOx). The aluminum oxide may react with a metal halide pre-clean solution or compound that forms barrier structures 122 and 130 (also referred to as a metal cap) in-situ. The barrier structures 122 and 130 may be self-aligned when formed in-situ. In other words, the barrier structures 122 and 130 may be formed within the same processing chamber or tool as the pre-clean step rather than being formed as a separate selective deposition step in a separate tool or processing chamber. The details of how the barrier structures 122 and 130 are formed and the features of the barrier structure 122 and 130 are discussed in further details below.

In one embodiment, the ILD layers 104-110 and the ESL 112-116 may be formed using any suitable deposition process. For example, deposition processes such as PECVD, CVD, PVD, ALD, high density plasma CVD, metal organic CVD, remote plasma CVD, low-pressure CVD, atomic layer CVD, atmospheric pressure CVD, plating, or any other suitable methods or combinations thereof, may be used. Additional processes may be carried out after the ILD layers 104-110 and the ESL 112-116 are deposited, such as annealing and planarization (e.g., chemical mechanical polishing (CMP)), and the like.

In one embodiment, the MLI structure 100 may include contact structures 120, 128, and 138, vias 124, 140, and 132, and conductive lines 126, 142, and 134 to form interconnected structures. The contact structures 120, 128, and 138 may be device-level contacts that electrically couple and/or physically couple IC device features to other conductive features of the MLI feature 160. For example, the contact structure 138 may be a metal-to-poly contact, which generally refers to a contact to a gate structure, such as a poly gate structure or a metal gate structure.

In FIG. 1, the contact structure 138 may be disposed on the gate structure 136, such that the contact structure 138 connects the gate structure 136 to the via 140. The contact structure 138 may extend through the ILD layer 106 and the ESL 112.

In one embodiment, the contact structures 120 and 128 may be metal-to-device contacts, which generally refer to contacts to a conductive region of the IC device 100 (e.g., the S/D regions 118). In FIG. 1, the contact structures 120 and 128 are disposed on respective S/D regions 118 such that the contact structure 120 connects the S/D region 118 to the via 124 and the contact structure 128 connects the S/D region 118 to the via 132. The contact structures 120 and 128 may extend through the ILD layer 104, the ILD layer 106, and the ESLs 112.

The contact structures 120, 128, ad 138 may include conductive metals that provide contact to a conductive region, such as the S/D regions 118. In one example, the contact structures 120, 128, ad 138 may include any conductive metal such as tantalum (Ta), titanium (Ti), aluminum (Al), Tungsten (W), cobalt (Co), tantalum nitride (TaN), titanium nitride (TiN), and the like.

In one embodiment, the MLI feature 160 may include vias 124, 132, and 140. The vias 124, 132, and 140 may electrically couple and/or physically couple conductive features of the MLI feature 160 to one another. The vias 124 and 132 may be formed through the ILD-2 layer 108 and on top of the barrier structure 122 and 130, respectively. In one example, the vias 124, 132, and 140 may be filled with a metal, such as ruthenium (Ru), Molybdenium (Mo), Rhodium (Rh), Niboium (Nb), and the like.

As discussed above, without the barrier structures 122 and 130, portions of the contact structures 120, 128, ad 138 may be corroded or etched away. However, the barrier structures 122 and 130 prevent corrosion of the respective contact structures 120 and 128, as discussed in further details below.

The conductive lines 126, 134, and 142 may be formed from any conductive metal. For example, the conductive lines 126, 134, and 142 may be formed from Ta, Ti, Al, W, Co, TaN, TiN, and the like. The conductive lines 126, 134, and 142 may be used to connect to other contacts in other ILD layers that are not shown.

Although the IC device 100 is illustrated with a certain example number of ILD layers 104-110 and ESLs 112-116, it should be noted that any number of ILD layers and ESLs may be deployed in the MLI structure 100.

In one embodiment, a photolithography process may be applied to pattern the openings in the ILD layers 104-110 and the ESL 112-116. In one embodiment, the photolithography process may include coating a resist layer on one of the layers (e.g., via a spin coating process). A pre-exposure baking process may be applied and the baked resist may be exposed with a light source (e.g., a ultra-violet (UV) light, extreme UV (EUV) light, and the like). For example, a mask with a desired pattern of the vias, structures, or features may be placed on top of a baked resist. The light source may be applied to the mask to expose the portions of the resist that are not blocked by the mask. In other embodiments, a negative exposure may be applied where mask defines undesired portions. Exposed portions of the resist may be chemically changed and dissolved during a developing process.

After the developing process the patterned resist layer may include a resist pattern that corresponds with the mask. The patterned resist layer may act as an etch mask for subsequent etch steps that remove portions of the underlying layers (e.g., the ILD layers 104-110 and/or the ESL 112-116).

Etching steps may be applied to create the vias in the respective ILD layers 104-110 and the ESL 112-116. The etching process may include a dry etching process (e.g., a reactive ion etching process), a wet etching process, or other suitable etching process, or any combinations thereof. After the etching process, the patterned resist layer may be removed (e.g., via a resist stripping process).

The materials in the contact structures 120, 128, and 138, the vias 124, 140, and 132, and the conductive lines 126, 142, and 134 may then be deposited into the vias that are etched using PVD, CVD, ALD, plating, and the like. Thereafter, excess portions of the deposited material may be removed via a planarization process. For example, a chemical mechanical polish (CMP) process may be applied to create a flat planar surface for the formation of subsequent layers.

Figure 2:
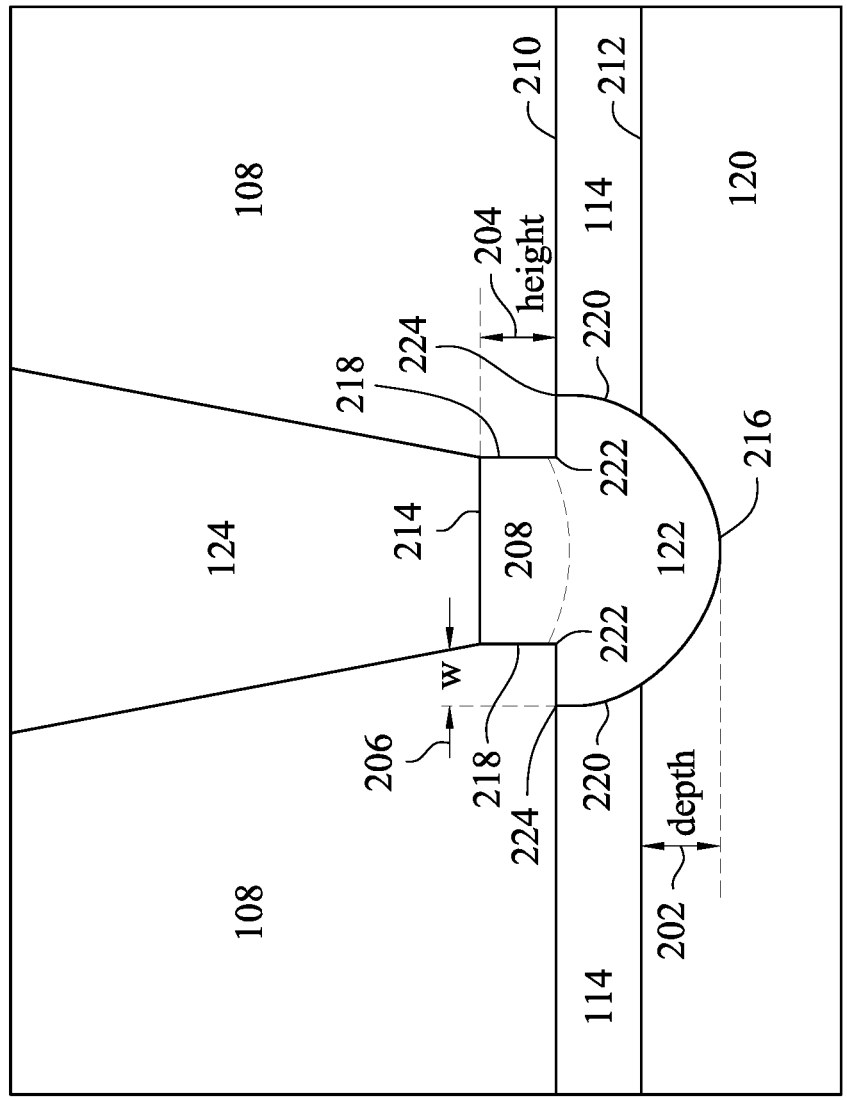
FIG. 2 illustrates a cross-sectional view of the self-aligned barrier structure according to at least one embodiment of the present disclosure.

FIG. 2 illustrates a more detailed cross-sectional view of portion A of the IC device 100 from FIG. 1. FIG. 2 illustrates additional details of the barrier structure 122 formed in-situ in the IC device 100. It should be noted that the details of the barrier structure 130 may be similar.

FIG. 2 illustrates some example dimensions of the barrier structure 122 that is formed. In one embodiment, the barrier structure 122 may have a height 204 that is less than 5 nanometers (nm) measured from a top surface 210 of the ESL 114 to a top surface 214 of the barrier structure 122. In one embodiment, a recess in the contact structure 120 may have a depth 202 that is less than 5 nm measured from a top surface 212 of the contact structure 120 to a bottom surface 216 of the recess.

In one embodiment, the overall size (e.g., the height 204 plus the depth 202) of the barrier structure 122 may be approximately 1-10 nm. The ESL 114 may have a thickness of approximately 3-5 nm. Thus, the barrier structure 122 may be formed through the ESL 114.

In one embodiment, a width 206 of the barrier structure 122 may be consumed by the ESL 114 during formation of the barrier structure 122. In one embodiment, the width 206 may be less than 2 nm per side (e.g., less than 2 nm on the left side as illustrated in FIG. 2 and less than 2 nm on the right side) that is consumed by the ESL 114.

In one embodiment, a metal nitride layer 208 may be optionally deposited onto the barrier structure 122. The metal nitride layer 208 may be a portion of the barrier structure 122 that is injected with $NH_3$ or $N_2$ to form a metal nitride. The "nitrided" barrier may provide an even stronger barrier to prevent corrosion of the metal in the contact structure 120 during deposition and processing of the metal into the via 124.

In one embodiment, a hydrogen ($H_2$) plasma clean, or any other type of critical dimension (CD) shrinkage free clean, may be applied after the barrier structure 122 is formed in-situ. The hydrogen plasma clean may remove metal oxides that may remain on an interface or the top surface 214 of the barrier structure 122. The hydrogen plasma may eliminate the use of an Ar clean or substantially reduce the amount of time the Ar clean is applied.

The hydrogen plasma clean may prevent the formation of "kinks" in the via 124 that may be formed when using an Ar clean. A "kink" may be defined as an additional amount of etching on the sides of the via 124 and over the top surface 214 of the barrier structure 122. For example, the sides of the via 124 may not align with sides 218 of the barrier structure 122, as illustrated in FIG. 2. Rather, the "kink" would cause the sides of the via 124 to be formed inside the outer edges of the top surface 214 of the barrier structure 122.

As noted above, the barrier structure 122, or metal cap, may be created in-situ during a metal halide pre-clean operation. In one example, the barrier structure 122 may be a metal. The metal may be any type of metal that can be combined to form a metal halide as part of the pre-cleaning process. For example, the metal may be tungsten (W), Ti, Ta, Aluminum (Al), Antimony (Sb), Arsenic (As), Bismuth (Bi), Cadmium (Cd), Cobalt (Co), Gallium (Ga), Germanium (Ge) Hafnium (Hf), Indium (In), Lead (Pb), Manganese (Mn), Silicon (Si), Tin (Sn), or Zinc (Zn). The metal halide that is used during the pre-clean operation may be a function of the metal that is used as the barrier structure 122. For example, the metal used as the barrier structure 122 may be the metal used in the metal halide. For example, if the barrier structure 122 is tungsten, then the metal halide may be tungsten fluoride. If the barrier structure 122 is titanium, then the metal halide may be titanium chloride. If the barrier structure 122 is tantalum, then the metal halide may be tantalum chloride.

In one embodiment, the ESL 114 may comprise aluminum oxide, the metal halide may comprise tungsten fluoride ($WF_6$), and the barrier structure 122 may comprise tungsten. In one embodiment, aluminum ions (e.g., $Al^{3+}$) and aluminum hydroxide (e.g., $Al(OH)_3$) released by the aluminum oxide during an etching step may react with the tungsten fluoride in the presence of heat to form tungsten. The tungsten may be deposited into a recess of the MD metal layer 120 and self-align itself with the MD layer 120 and the subsequently deposited Ru in the via 124. The details of the reactions are discussed in further details below and illustrated in FIGS. 4A and 4B.

In one embodiment, a thickness of the barrier structure 122 may be a function of various parameters associated with the metal halide pre-clean operation. For example, the parameters may include a flow rate of the metal halide, a temperature, a pressure, and an amount of time. In one embodiment, the metal halide may be provided at approximately 100-300 standard cubic centimeters per minute (sccm) at a pressure of approximately 2 Torr (T) to 6 T at approximately 300 degrees Celsius (° C.) to 450° C. for approximately 5-60 seconds (s). In one embodiment, the thickness of the barrier structure 122 may increase as the temperature is increased.

FIG. 2 illustrates an example shape of the barrier structure 122. In one example, the shape of the barrier structure 122 may have a semi-spherical shape with a rectangular neck, as shown in FIG. 2. However, the actual shape of the barrier structure 122 may vary based on a variety of parameters. For example, the shape of the barrier structure 122 may depend on the type of metal that is deposited for the barrier structure 122, the diameter of the via 124, and the like. For example, the grain structure of the metal may determine the shape of the bottom surface 216. The shape of the bottom surface 216 may follow the grain structure and size of the metal that is used in the barrier structure 122.

In addition, for vias with high aspect ratios, the bottom surface 216 may be formed to be more flat or rectangular, rather than curved as shown in FIG. 2. In some embodiments, the bottom surface 216 may be multi-faceted. For example, rather than a smooth continuous surface, the bottom surface 216 may be formed via multiple segments that are angled together.

Moreover, corners 222 of the barrier structure 122 may be curved or rounded. Corners 224 may also be further extended into the ESL 114 due to a wet etch process that may be used to form the opening for the barrier layer 122.

In one embodiment, the sides 220 within the ESL 114 may be slight curved as shown in FIG. 2. However, in other embodiments, the sides 220 may be straight or vertical through the ESL 114.

Although FIG. 2 illustrates a single neck (e.g., the portion of the barrier structure 122 that includes the top surface 214 and the sides 218), the barrier structure 122 may include multiple neck structures.

Figure 3:
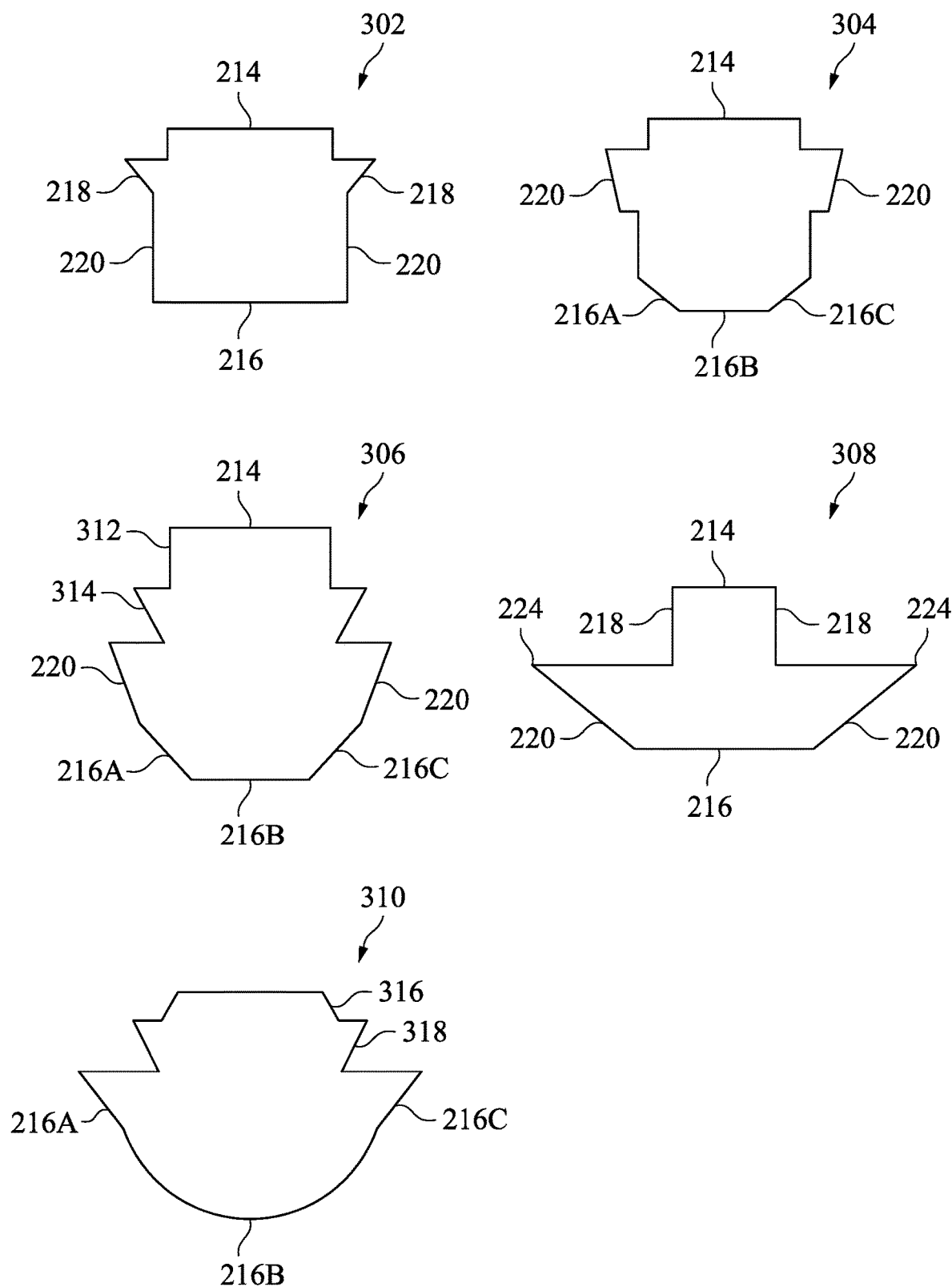
FIG. 3 illustrates example shapes of the barrier structure according to at least one embodiment of the present disclosure.

FIG. 3 illustrates some examples of different shapes that can be formed for the barrier structure 122, as described above. It should be noted that FIG. 3 only provides a few examples, but other shapes may be formed that are within the scope of the present disclosure.

In addition to the example shape illustrated in FIG. 2, FIG. 3 illustrates example shapes 302, 304, 306, 308, and 310 for the barrier layer 122. For example, the shape 302 illustrates a more rectangular shape formed by the sides 220 and the bottom surface 216. In addition, the sides 218 may be angled rather than being vertical as illustrated in FIG. 2.

The shape 304 illustrates how the sides 220 may protrude out to form "arms". For example, the "arms" may extend into the ESL 114. In addition, the bottom surface 216 may be formed via multiple angled segments 216A, 216B and 216C. Thus, rather than one smooth continuous surface, the bottom surface 216 may be formed via multiple linear segments.

The shape 306 illustrates the bottom surface 216 also being formed by multiple segments 216A, 216B, and 216C. However, in one embodiment, the barrier structure 122 may include multiple "necks" 312 and 314. Moreover, the sides for each "neck" 312 and 314 may be formed in parallel or may be angled differently, as shown in FIG. 3.

The shape 308 illustrates an example of the corners 224 being extended further away from the sides 218. As noted above, due to a wet etch process, the corners 224 may be extended at the interface between the ILD layer 108 and the ESL 114. In addition, rather than having a curved bottom surface 216, the barrier structure 122 may have flat bottom surface with angled sides 220.

The shape 310 illustrates an example with multiple necks 316 and 318. However, the sides of the neck 316 may be angled slightly towards each other rather than away from one another, as shown by the neck 318. In addition, the bottom surface 216 may be formed via a combination of straight segments 216A and 216C and a curved portion 216B.

Figure 4A:
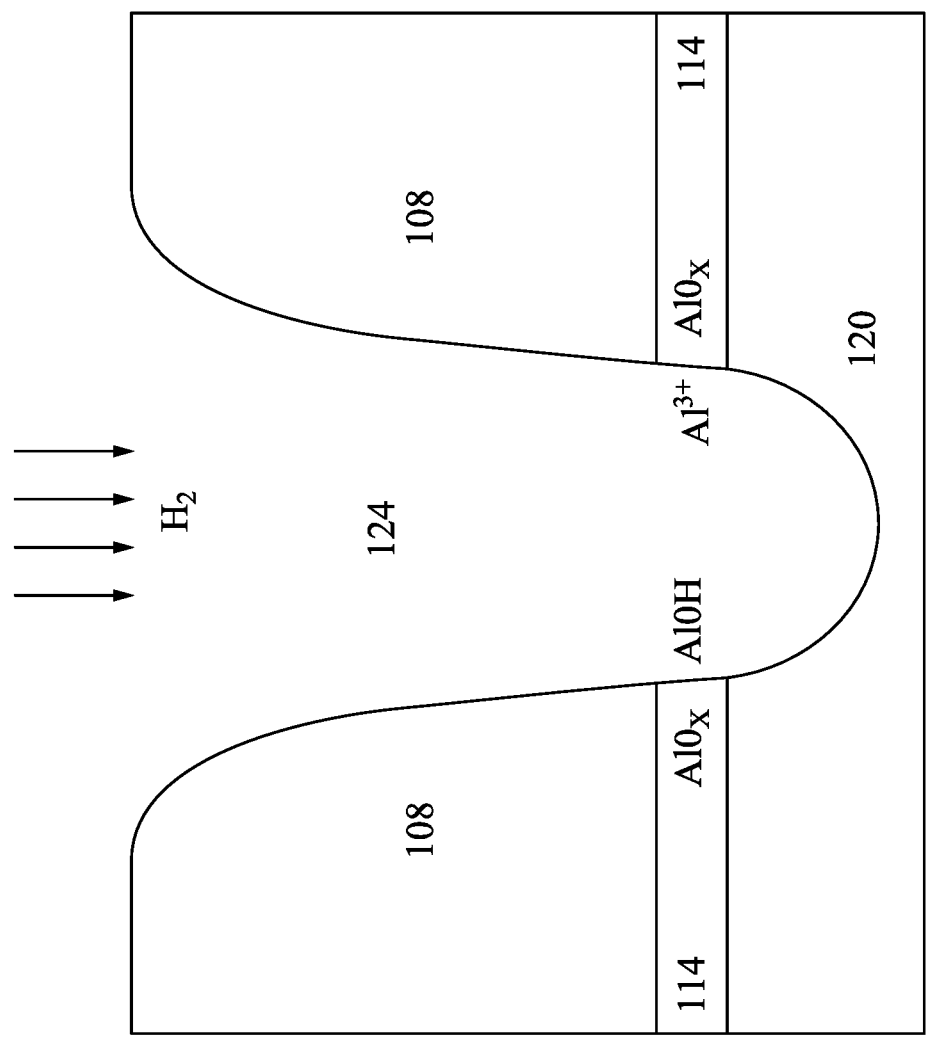
FIGS. 4A and 4B illustrate an example of how a metal of the barrier structure is deposited according to at least one embodiment of the present disclosure.
Figure 4B:
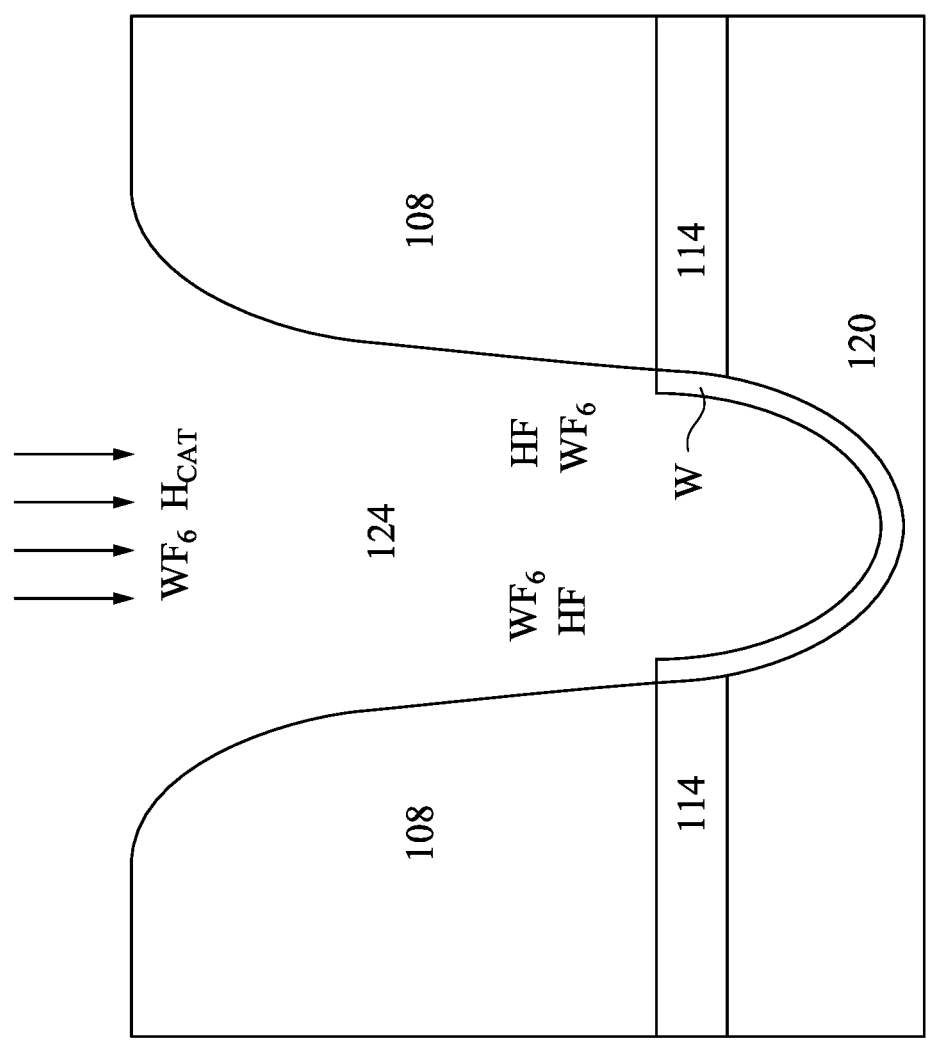

FIGS. 4A and 4B illustrates an example of a process of depositing a metal via a pre-clean process to form the barrier structure 122. The barrier structure 122 may be formed in a variety of different shapes with a variety of different metals as described above. However, FIG. 4 illustrates an example, wherein the barrier structure 122 is formed with tungsten (W) and a tungsten halide ($WF_6$).

In FIG. 4A a via 124 may be formed via a dry plasma etch, followed by a wet etch, and a hydrogen plasma etch. In one embodiment, the ESL 114 may be aluminum oxide (e.g., $AlO_x$). Hydrogen protons from the hydrogen plasma etch may react with the surface of the $AlO_x$ to for $Al^{3+}$, $Al(OH)_3$, and $AlO(OH)$. For example, the chemical reactions may be as follows:

$$Al_2O_3 + 6H^+ => 2Al^{3+} + 3H_2O \qquad (1)$$

$$Al(OH)_3 + 3H^+ => Al^{3+} + 2H_2O \qquad (2)$$

$$Al_2O_3 + 3H_2O => 2Al(OH)_3 \qquad (3)$$

In FIG. 4B, a metal halide pre-clean may then be added. For example, the metal halide may be $WF_6$. The $WF_6$ may be provided at approximately 100-300 sccm at approximately 2 T to 6 T of pressure at approximately 300° C. to 450° C. for 5-60 seconds. In one embodiment, the $WF_6$ may react with the $Al(OH)_3$ and $Al^{3+}$ formed in equations (1)-(3) above to form a hydrogen halide HF. The HF may then react with the heat to form hydrogen gas $H_2$ and a halide gas $F_2$. The $H_2$ may react with the $WF_6$ to form W metal and more HF. The chemical reactions may be as follows:

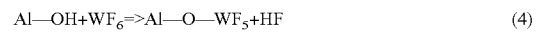
$$Al-OH + WF_6 => Al-O-WF_5 + HF \qquad (4)$$

$$Al^{3+} + WF_6 => AlF + WF_5 \qquad (5)$$

$$HF + heat => H_2 + F_2 \qquad (6)$$

$$WF_6 + H_2 => W + HF \qquad (7)$$

At high temperatures, $Al(OH)_3$ may be capable of forming $AlF_x(OH)_x$. For example, the $AlF_x(OH)_x$ may be formed slowly to approximately 1 nm, which can enhance the formation of W from $WF_6$. FIG. 4B illustrates a layer of W forming along the surface of the ESL 114 and the contact structure 120. Over time, the W may be deposited to form a shape as shown in FIGS. 2 and 3, and discussed above.

Figure 5:
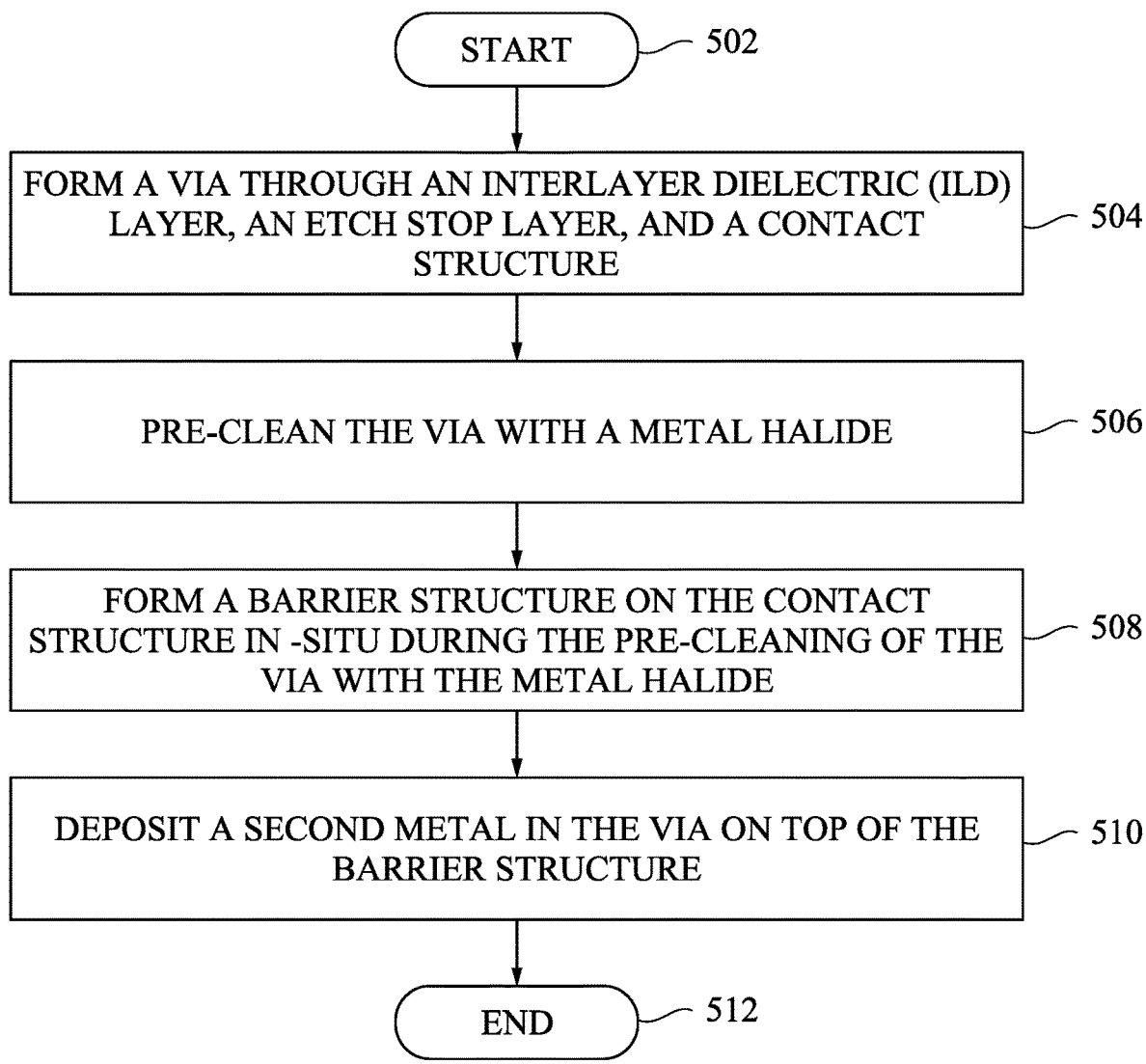
FIG. 5 illustrates a flowchart of a method of forming a self-aligned barrier structure in a via according to at least one embodiment of the present disclosure.

FIG. 5 illustrates a flowchart of a method 500 of forming a self-aligned barrier structure in a ruthenium via according to at least one embodiment of the present disclosure. The method 500 may be performed via one or more different tools within a fabrication plant under the control of a controller or processor.

While the method 500 is illustrated and described below as a series of acts or events, it will be appreciated that the illustrated ordering of such acts or events are not to be interpreted in a limiting sense. For example, some acts may occur in different orders and/or concurrently with other acts or events apparat from those illustrated and/or described herein. In addition, not all illustrated acts may be required to implement one or more aspects or embodiments of the description herein. Further, one or more of the acts depicted herein may be carried out in one or more separate acts and/or phases.

At block 502, the method 500 begins. At block 504, the method 500 forms a via through an interlayer dielectric (ILD) layer and an etch stop layer (ESL), and a contact structure. For example, the via may be etched to form a recess into the contact structure.

At block 506, the method 500 pre-cleans the via with a metal halide. In one embodiment, the metal in the metal halide may be the same as the metal that is used to eventually form the barrier structure. For example, if the barrier structure will be formed as a tungsten cap, then the metal halide may include tungsten (e.g., tungsten fluoride).

At block 508, the method 500 forms a barrier structure on the contact structure in-situ during the pre-cleaning of the via with the metal halide. In one embodiment, a metal nitride layer may be formed in the barrier structure with $NH_3$ or $N_2$ before another metal (e.g., Ru) is deposited on top of the barrier structure.

At block 510, the method 500 deposits a second metal in the via on top of the barrier structure. For example, the second metal may be Ru. In one embodiment, a planarization process (e.g., a CMP process) may be applied to the Ru that is deposited to create a flat planar surface for subsequently deposited layers. At block 512, the method 500 ends.

Figure 6:
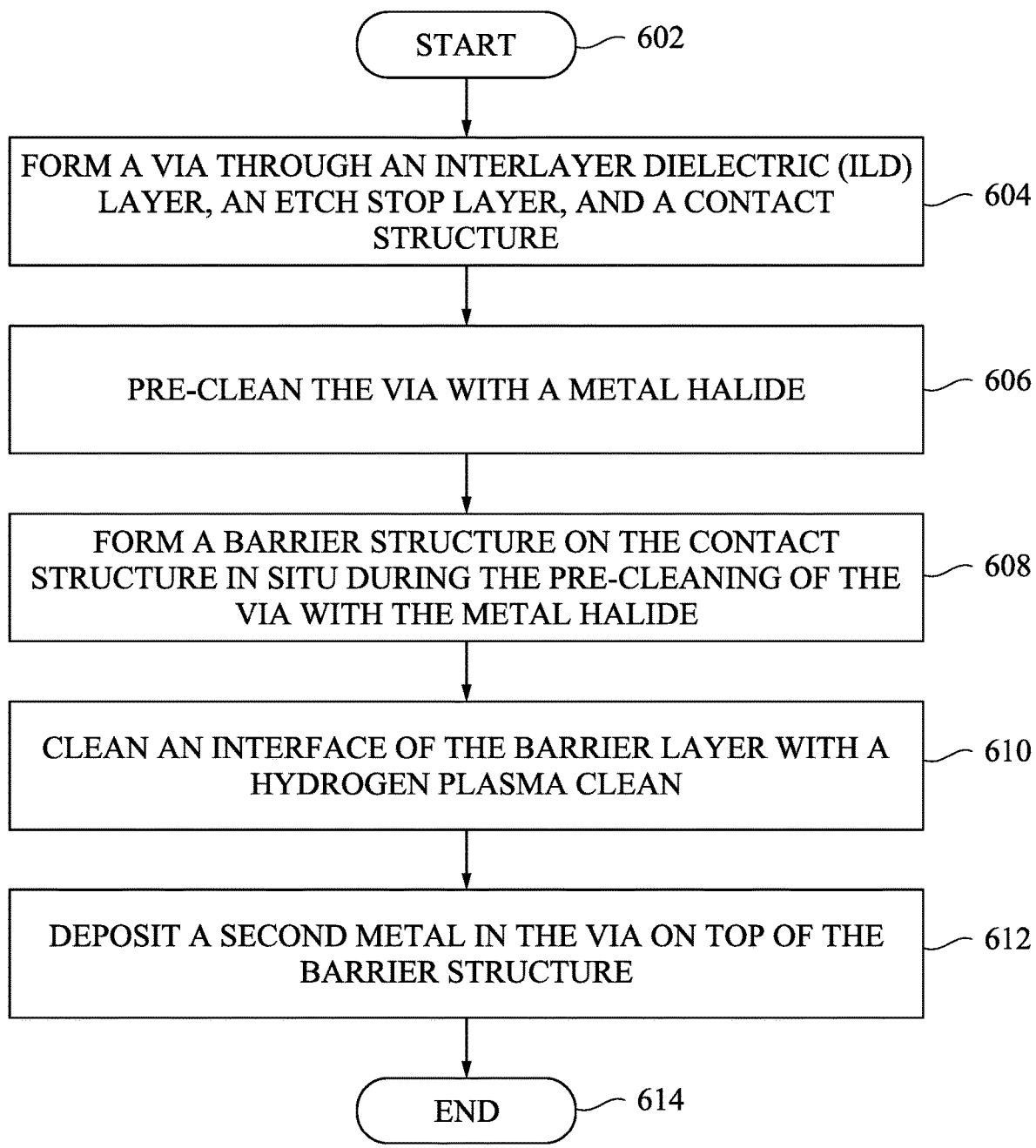
FIG. 6 illustrates a flowchart of another method of forming a self-aligned barrier structure in a via according to at least one embodiment of the present disclosure.

FIG. 6 illustrates a flowchart of a method 600 of forming a semiconductor sensor device according to at least one embodiment of the present disclosure. The method 600 may be performed via one or more different tools within a fabrication plant under the control of a controller or processor.

While the method 600 is illustrated and described below as a series of acts or events, it will be appreciated that the illustrated ordering of such acts or events are not to be interpreted in a limiting sense. For example, some acts may occur in different orders and/or concurrently with other acts or events apparat from those illustrated and/or described herein. In addition, not all illustrated acts may be required to implement one or more aspects or embodiments of the description herein. Further, one or more of the acts depicted herein may be carried out in one or more separate acts and/or phases.

The method 600 begins at block 602. At block 604, the method 600 forms a via through an interlayer dielectric (ILD) layer, an etch stop layer (ESL), and a contact structure. For example, the via may be etched to form a recess into the contact structure.

At block 606, the method 600 pre-cleans the via with a metal halide. In one embodiment, the metal in the metal halide may be the same as the metal that is used to eventually form the barrier structure. For example, if the barrier structure will be formed as a tungsten cap, then the metal halide may include tungsten (e.g., tungsten fluoride).

At block 608, the method 600 forms a barrier structure on the contact structure in-situ during the pre-cleaning of the via with the metal halide. In one embodiment, a metal nitride layer may be formed in the barrier structure with $NH_3$ or $N_2$ before ruthenium is deposited on top of the barrier structure.

At block 610, the method 600 cleans an interface of the barrier structure with a hydrogen plasma clean. For example, the hydrogen plasma clean may be a CD shrinkage free cleaning process. The hydrogen plasma clean may remove remaining metal oxides on the top surface of the barrier structure without creating "kinks" in the via.

At block 612, the method 600 deposits a second metal in the via on top of the barrier structure. In one embodiment, the second metal may be Ru. In one embodiment, a planarization process (e.g., a CMP process) may be applied to the Ru that is deposited to create a flat planar surface for subsequently deposited layers. At block 614, the method 600 ends.

Figure 7A:
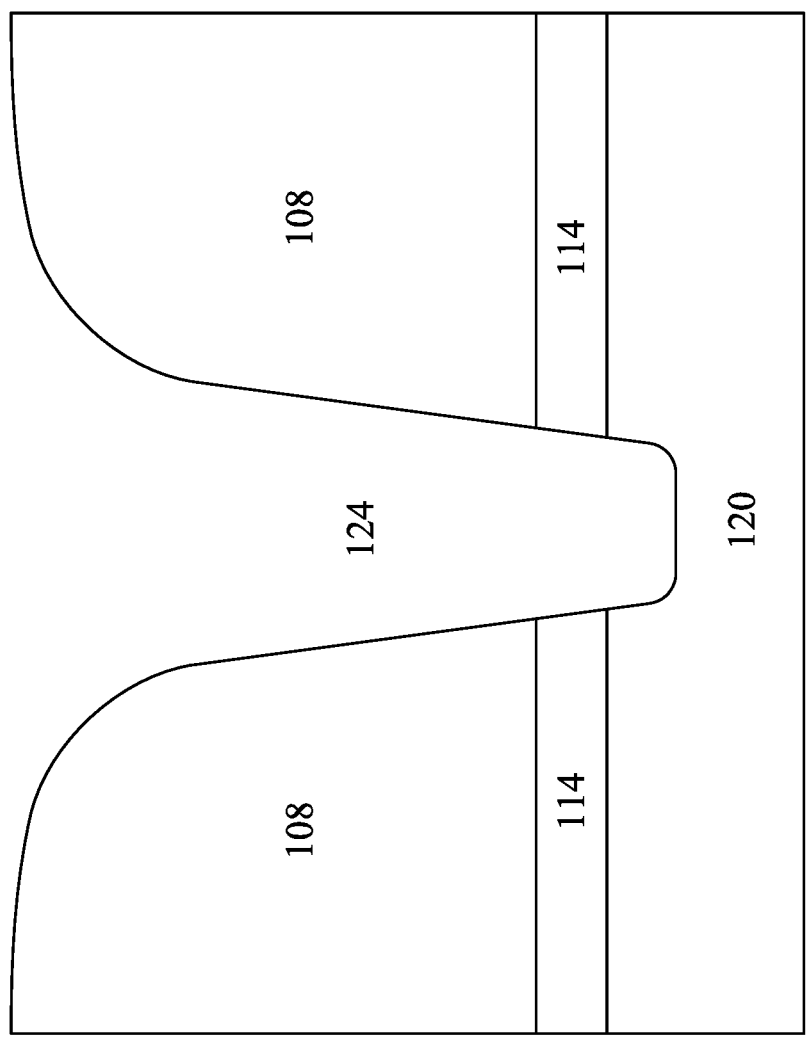
FIGS. 7A-7E are partial cross-sectional views of the semiconductor sensor device at various stages of manufacture in accordance with at least one embodiment of the present disclosure.

FIGS. 7A-7E illustrate a plurality of partial cross-sectional views illustrating one embodiment of a method of forming the IC device 100 at various stages of manufacture in accordance with at least one embodiment of the present disclosure. Referring to FIG. 7A, a portion of the IC device 100 is illustrated. The portion of the IC device 100 may include the contact structure 120, the ESL 114, and the ILD-2 layer 108 illustrated in FIG. 1.

In one embodiment, the contact structure 120 may be any type of conductive metal, such as Ta, Ti, Al, W, Co, TaN, TiN, and the like. The ESL 114 may be silicon nitride or a metal oxide layer. In one embodiment, the ESL 114 may be a metal oxide layer such as aluminum oxide (e.g., $AlO_3$). The ILD layer 108 may be a dielectric material, such as, silicon oxide, silicon nitride, silicon oxynitride, TEOS formed oxide, PSG BPSG low-k dielectric material, or any combination thereof. The contact structure 120, the ESL 114, and the ILD layer 108 may be deposited or formed, as described above, with respect to FIG. 1.

In one embodiment, a via 124 may be etched through the ILD layer 108, the ESL 114, and the contact structure 120. The via 124 may form a recess in the contact structure 120. As illustrated in FIG. 2, the recess of the via 124 may be formed to have a depth of less than 5 nm into the contact structure 120. The via 124 may be formed via photolithography process to pattern the via 124 followed by an etching process. A wet etch, a dry etch, or any combination thereof, may be used to etch the via 124.

Figure 7B:
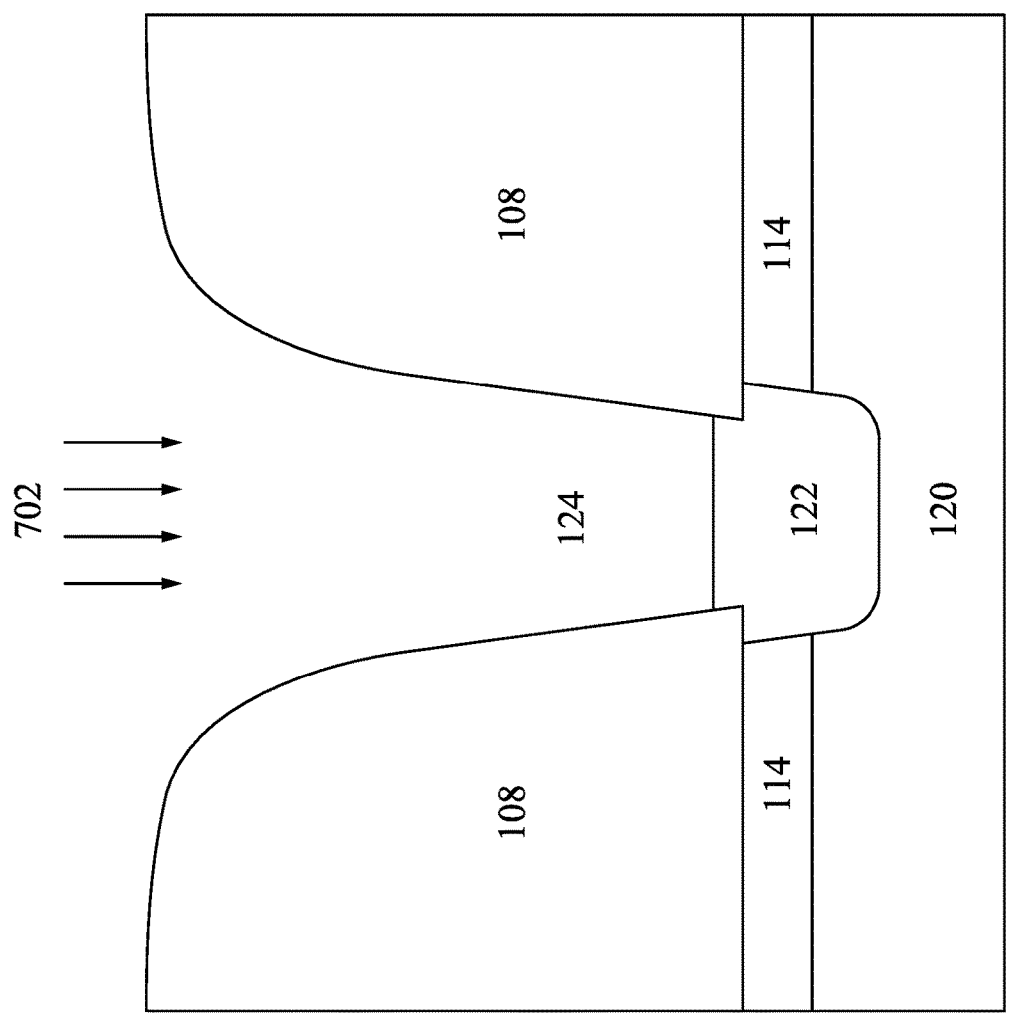

In FIG. 7B, a metal halide clean 702 may be applied to the via 124. As discussed above, the metal in the metal halide clean may be the same metal used to form a barrier structure 122. The barrier structure 122 may be formed in-situ during the metal halide clean.

For example, when the barrier structure 122 to be formed is a tungsten cap, the metal halide may be tungsten fluoride. The ESL 114 may be a metal oxide. In one embodiment, aluminum ions (e.g., $Al^{3+}$) and aluminum hydroxide (e.g., $Al(OH)_3$) may be released by the aluminum oxide ESL 114 during an etching step. The aluminum ions and/or the aluminum hydroxide may react with the tungsten fluoride in the presence of heat to form tungsten. The tungsten may be deposited into a recess of the contact structure 120 and self-align itself with the contact structure 120 and the subsequently deposited second metal (e.g., Ru) in the via 124.

As noted above, if the barrier structure 122 is to be formed with titanium, then the metal halide may be titanium chloride. If the barrier structure 122 is to be formed with tantalum, then the metal halide may be tantalum chloride, and so forth.

In one embodiment, a thickness of the barrier structure 122 may be controlled by a variety of different parameters associated with the metal halide pre-clean operation. For example, the thickness of the barrier structure 122 may be a function of a flow rate of the metal halide, a temperature, a pressure, and an amount of time.

The shape of the barrier structure 122 may be a function of a type of metal that is used, an aspect ratio of the via 124, and the like. For example, the shape of the barrier structure 122 may follow a grain pattern and/or size of the metal that is used for the barrier structure 122.

Figure 7C:
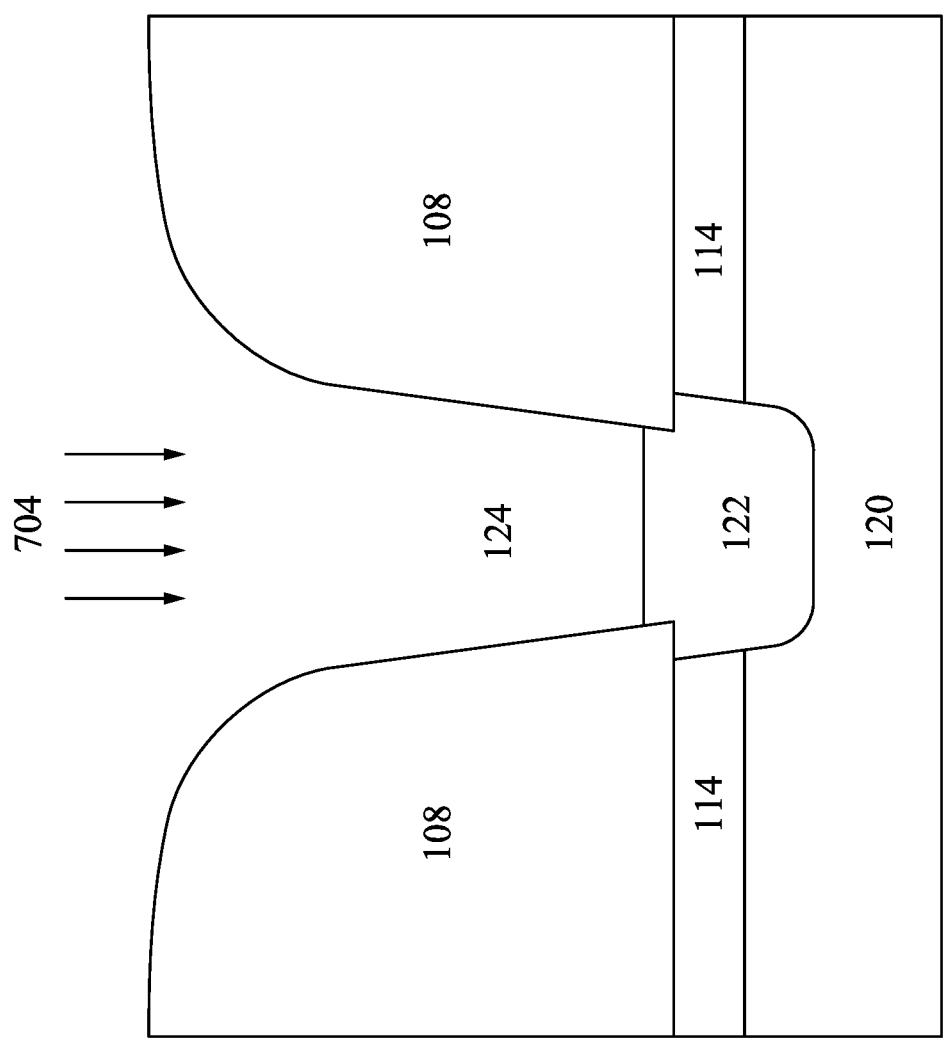

In FIG. 7C, a plasma clean 704 may be applied. The plasma clean 704 may be a hydrogen (H$_2$) plasma clean that may remove metal oxides that remain on the top surface or interface of the barrier structure 122. For example, when the barrier structure 122 is a tungsten cap, the tungsten cap may have tungsten oxide remaining on the top surface of the tungsten cap. The hydrogen plasma clean may remove the tungsten oxide.

However, the hydrogen plasma clean may prevent the formation of kinks in the via 124, unlike physical Ar cleaning processes. Kinks may be formed when side portions of the via 124 near the barrier structure 122 become narrower or etched away. As a result, re-sputtering processes may be used to re-grow the side walls of the via 124 to achieve a desired CD of the via 124. The hydrogen plasma clean may replace the physical Ar cleaning process, or significantly reduce the amount of time the physical Ar cleaning process is applied.

Figure 7D:
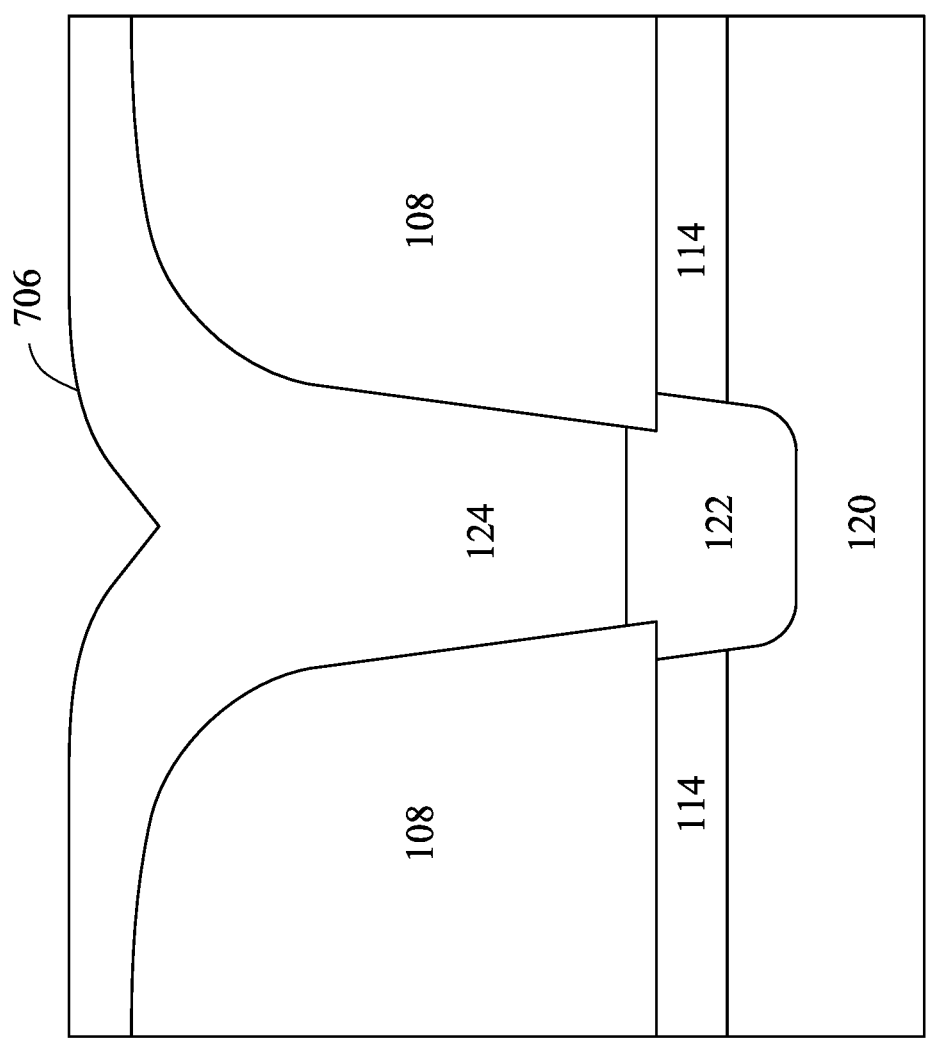

In FIG. 7D, a second metal 706 may be deposited into the via 124. In one embodiment, the second metal may be Ru, Nb, Mo, Rh, and the like. The second metal 706 may be deposited using a bulk metal deposition process. For example, the ruthenium may be deposited using PVD, CVD, ALD, plating, and the like.

Figure 7E:
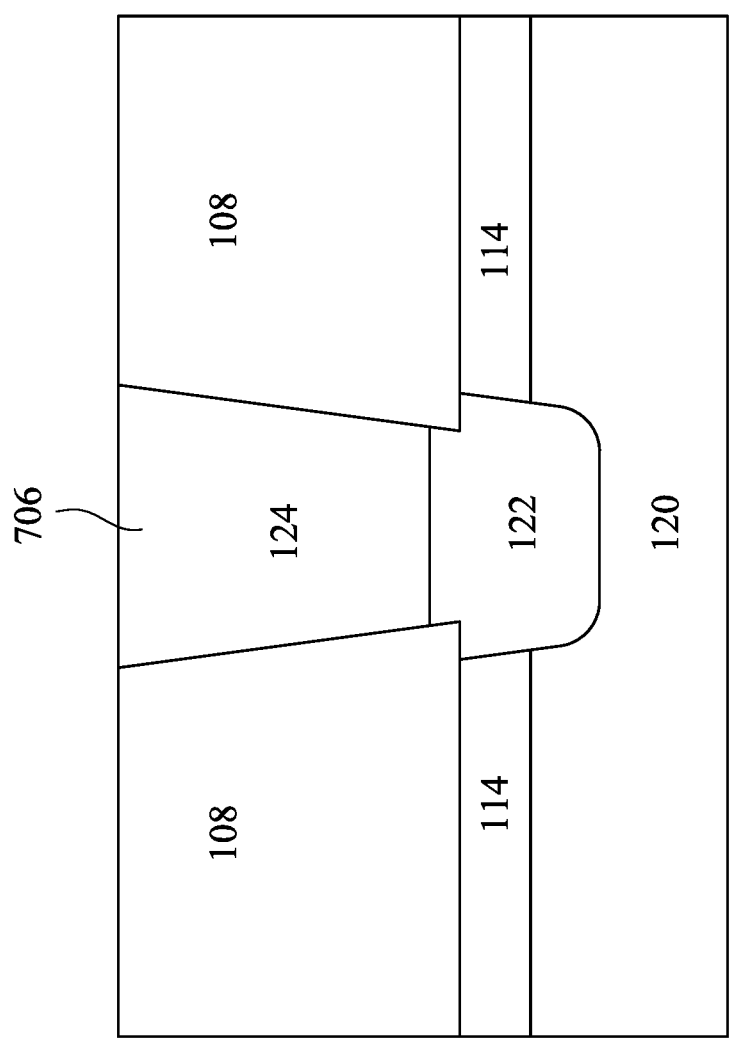

In FIG. 7E, a planarization process may be applied to the second metal 706 that is deposited into the via 124. For example, a planarization process, such as a chemical mechanical polish process, may be used to create a flat surface to receive subsequent layers (e.g., ILD-3 layer 110 and the conductive layer 126 illustrated in FIG. 1, and discussed above.

Thus, the present disclosure provides a method to form a self-aligning barrier structure that prevents corrosion of the metal in the MD metal layer below the barrier structure. The barrier structure may be formed in-situ during a metal halide pre-cleaning operation, rather than using a separate selective deposition process. As a result, the barrier structure can be formed more efficiently and at a lower cost than other methods used to create a barrier structure between an Ru via and an MD metal layer.

Therefore, the present disclosure relates to a method for forming a multi-layer interconnect structure that has a self-aligning barrier structure formed in-situ in a metal via. In some embodiments, the method includes forming a via through an interlayer dielectric (ILD) layer, an etch stop layer (ESL), and a contact structure. The via is pre-cleaned with a metal halide before a second metal is deposited into the via. The metal halide pre-clean forms a metal used for the barrier structure on the contact structure in-situ. After the barrier structure is formed, the second metal is deposited into the via on top of the barrier structure.

In yet other embodiments, the method includes forming a via through an interlayer dielectric (ILD) layer, an etch stop layer (ESL), and a contact structure. The via is pre-cleaned with a metal halide before a second metal is deposited into the via. The metal halide pre-clean forms the barrier structure on the contact structure in-situ. An interface of the barrier structure is cleaned with a hydrogen plasma clean. After the interface of the barrier structure is cleaned, the second metal is deposited into the via on top of the barrier structure.

In yet other embodiments, a multi-layer interconnect structure is formed with a self-aligning barrier structure. The multi-layer interconnect structure includes a contact structure formed on a source-drain. A metal oxide etch stop layer is formed on the contact structure. An interlayer dielectric (ILD) layer is formed on the metal oxide etch stop layer. The barrier structure is formed in the contact structure in-situ during a metal halide clean. A via is formed through the ILD layer on the barrier structure. The via can be filled with a second metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a via through an interlayer dielectric (ILD) layer, an etch stop layer (ESL), and a contact structure;
    pre-cleaning the via with a metal halide;
    forming a barrier structure on the contact structure in-situ during the pre-cleaning of the via with the metal halide; and
    depositing a second metal in the via on top of the barrier structure.

2. The method of claim 1, wherein the ESL comprises a metal oxide.

3. The method of claim 2, wherein the ESL comprises aluminum oxide.

4. The method of claim 1, wherein a metal of the barrier structure is the metal used in the metal halide.

5. The method of claim 4, wherein the metal comprises tungsten (W), Titanium (Ti), Tantalum (Ta), Aluminum (Al), Antimony (Sb), Arsenic (As), Bismuth (Bi), Cadmium (Cd), Cobalt (Co), Gallium (Ga), Germanium (Ge), Hafnium (Hf), Indium (In), Lead (Pb), Manganese (Mn), Silicon (Si), Tin (Sn), or Zinc (Zn).

6. The method of claim 1, wherein the forming comprises:
    heating a hydrogen halide formed from a reaction of the metal halide with the ESL to form a hydrogen gas and a halide gas; and
    reacting the hydrogen gas with the metal halide to form the metal and the hydrogen halide.

7. The method of claim 1, further comprising:
    forming a metal nitride layer on the barrier structure before the second metal is deposited on top of the barrier structure.

8. A method, comprising:
    forming a via through an interlayer dielectric (ILD) layer, an etch stop layer (ESL), and a contact structure;
    pre-cleaning the via with a metal halide;
    forming a barrier structure on the contact structure in-situ during the pre-cleaning of the via with the metal halide;
    cleaning an interface of the barrier structure with a hydrogen plasma clean; and
    depositing a second metal in the via on top of the barrier structure.

9. The method of claim 8, wherein the via is recessed into the contact structure by less than 5 nanometers.

10. The method of claim 8, wherein the barrier structure has a thickness above a top surface of the ESL that is less than 5 nanometers.

11. The method of claim 8, wherein the ESL may consume less than 2 nanometers per side of the barrier structure during the hydrogen plasma clean.

12. The method of claim 8, wherein an overall thickness of the barrier structure is a function of temperature, etching time, flow rate of the metal halide, and a thickness of the ESL.

13. The method of claim 8, wherein a shape of the barrier structure is a function of a grain size of a metal of the metal halide, a grain structure of the metal of the metal halide, and an aspect ratio of the via.

14. The method of claim 8, wherein a metal of the barrier structure is the metal used in the metal halide.

15. The method of claim 14, wherein the metal comprises tungsten (W), Titanium (Ti), Tantalum (Ta), Aluminum (Al), Antimony (Sb), Arsenic (As), Bismuth (Bi), Cadmium (Cd), Cobalt (Co), Gallium (Ga), Germanium (Ge) Hafnium (Hf), Indium (In), Lead (Pb), Manganese (Mn), Silicon (Si), Tin (Sn), or Zinc (Zn).

16. The method of claim 8, wherein the forming comprises:
   heating a hydrogen halide formed from a reaction of the metal halide with the ESL to form a hydrogen gas and a halide gas; and
   reacting the hydrogen gas with the metal halide to form the metal and the hydrogen halide.

17. A multi-layer interconnect structure, comprising:
   a contact structure formed on a source-drain;
   a metal oxide etch stop layer formed on the contact structure;
   an interlayer dielectric (ILD) layer formed on the metal oxide etch stop layer;
   a barrier structure formed in the contact structure, wherein the barrier structure is formed in-situ during a metal halide clean; and
   a via formed through the ILD layer on the barrier structure, wherein the via is filled with a second metal.

18. The multi-layer interconnect structure of claim 17, wherein a bottom surface of the barrier structure is curved.

19. The multi-layer interconnect structure of claim 17, wherein a bottom surface of the barrier structure is flat.

20. The multi-layer interconnect of claim 17, wherein a bottom surface of the barrier structure is formed via a plurality of angled segments.

* * * * *